(12) United States Patent
Matsubara

(10) Patent No.: US 10,083,973 B1
(45) Date of Patent: Sep. 25, 2018

(54) APPARATUSES AND METHODS FOR READING MEMORY CELLS

(71) Applicant: MICRON TECHNOLOGY, INC., Boise, ID (US)

(72) Inventor: Yasushi Matsubara, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/673,224

(22) Filed: Aug. 9, 2017

(51) Int. Cl.
*G11C 11/22* (2006.01)
*H01L 27/11502* (2017.01)
*H01L 27/10* (2006.01)
*H01L 49/02* (2006.01)
*G11C 5/14* (2006.01)

(52) U.S. Cl.
CPC ........ *H01L 27/11502* (2013.01); *G11C 5/147* (2013.01); *G11C 11/22* (2013.01); *G11C 11/221* (2013.01); *G11C 11/2259* (2013.01); *H01L 27/101* (2013.01); *H01L 28/55* (2013.01)

(58) Field of Classification Search
CPC .................................. G11C 11/22; G11C 7/12
USPC .................................................. 365/145, 205
See application file for complete search history.

(56) References Cited

U.S. PATENT DOCUMENTS

| | | | |
|---|---|---|---|
| 4,888,733 A | 12/1989 | Mobley et al. | |
| 8,085,573 B2 * | 12/2011 | Shiratake | G11C 29/808 365/145 |
| 8,228,707 B2 * | 7/2012 | Nishimura | G11C 11/22 365/145 |
| 8,274,846 B2 * | 9/2012 | Shiga | G11C 5/147 365/145 |
| 2005/0195639 A1 * | 9/2005 | Fukushi | G11C 11/22 365/149 |
| 2006/0202668 A1 * | 9/2006 | Tran | G11C 5/145 323/215 |
| 2008/0084730 A1 * | 4/2008 | Hoya | G11C 11/22 365/145 |
| 2009/0027524 A1 * | 1/2009 | Cho | H03F 1/56 348/255 |
| 2009/0231902 A1 * | 9/2009 | Takashima | G11C 5/063 365/145 |
| 2010/0014341 A1 * | 1/2010 | Takashima | G11C 11/22 365/145 |
| 2012/0008445 A1 * | 1/2012 | Parris | G11C 7/02 365/203 |
| 2014/0320104 A1 * | 10/2014 | Guo | H02M 1/14 323/290 |
| 2015/0009734 A1 * | 1/2015 | Stahl | H02M 7/483 363/98 |

(Continued)

*Primary Examiner* — Michael Tran
(74) *Attorney, Agent, or Firm* — Dorsey & Whitney LLP

(57) ABSTRACT

Apparatuses and methods for reading memory cells are described. An example method includes sharing a first voltage to increase a voltage of a first sense line coupled to a first capacitor plate of a ferroelectric capacitor of a memory cell, sharing a second voltage to decrease a voltage of a second sense line coupled to a second capacitor plate of the ferroelectric capacitor of the memory cell, sharing a third voltage to increase the voltage of the second sense line, and sharing a fourth voltage to decrease the voltage of the first sense line. A voltage difference between the first sense line and the second sense line that results from the voltage sharing is amplified, wherein the voltage difference is based at least in part on a polarity of the ferroelectric capacitor.

25 Claims, 9 Drawing Sheets

(56) References Cited

U.S. PATENT DOCUMENTS

2017/0287541 A1* 10/2017 Vimercati ........... G11C 11/2273
2018/0102157 A1* 4/2018 Bedeschi ............ G11C 11/2259

* cited by examiner

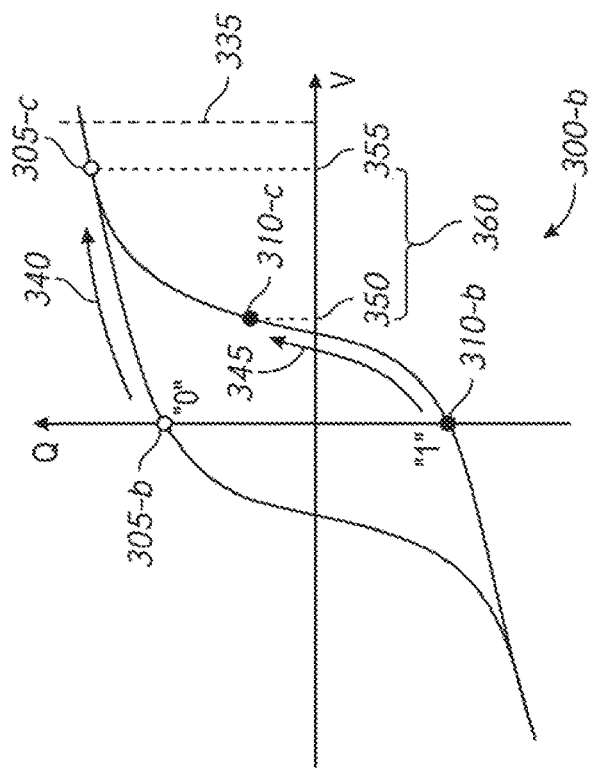
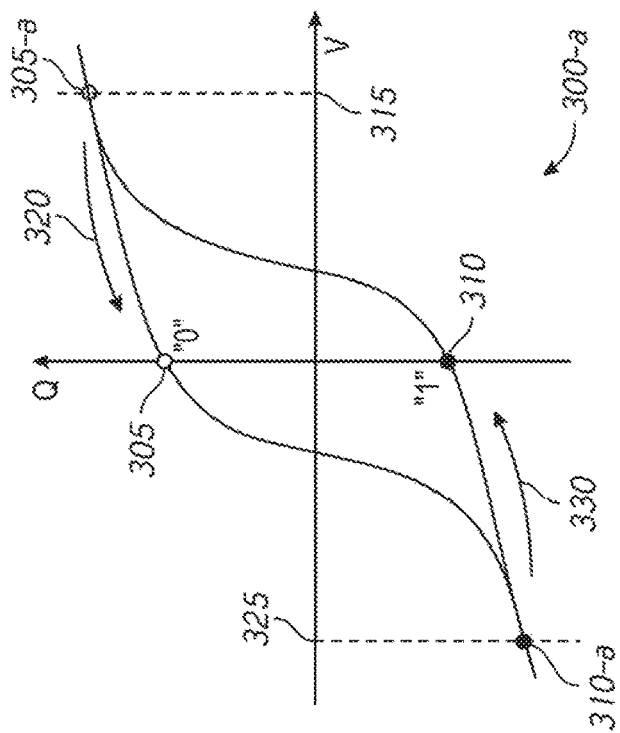
FIG. 3B
FIG. 3A

APPARATUSES AND METHODS FOR READING MEMORY CELLS

BACKGROUND

Memory devices are widely used to store information in various electronic devices such as computers, wireless communication devices, cameras, digital displays, and the like. Information is stored by programming different states of a memory device. For example, binary devices have two states, often denoted by a logic "1" or a logic "0." In other systems, more than two states may be stored. To access the stored information, the electronic device may read, or sense, the stored state in the memory device. To store information, the electronic device may write, or program, the state in the memory device.

Various types of memory devices exist, including random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, and others. Memory devices may be volatile or non-volatile. Non-volatile memory, e.g., flash memory, can store data for extended periods of time even in the absence of an external power source. Volatile memory devices, e.g., DRAM, may lose their stored state over time unless they are periodically refreshed by an external power source. A binary memory device may, for example, include a charged or discharged capacitor. A charged capacitor may, however, become discharged over time through leakage currents, resulting in the loss of the stored information. Certain features of volatile memory may offer performance advantages, such as faster read or write speeds, while features of non-volatile memory, such as the ability to store data without periodic refreshing, may be advantageous.

FeRAM may use similar device architectures as volatile memory but may have non-volatile properties due to the use of memory cells that include a ferroelectric capacitor as a storage device. FeRAM devices may thus have improved performance compared to other non-volatile and volatile memory devices. However, typical approaches to accessing (e.g., reading, writing, etc.) FeRAM memory cells often utilize complicated circuitry and complicated sequences of internal control signals, which results in disadvantages in terms of circuit design and compactness, and power consumption.

BRIEF DESCRIPTION OF THE DRAWINGS

FIG. 3A and FIG. 3B are diagrams of example non-linear electrical properties for a ferroelectric memory cell in accordance with various embodiments of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring the disclosure. Additionally, terms such as "couples" and "coupled" mean that two components may be directly or indirectly electrically coupled. Indirectly coupled may imply that two components are coupled through one or more intermediate components.

Figure 1:
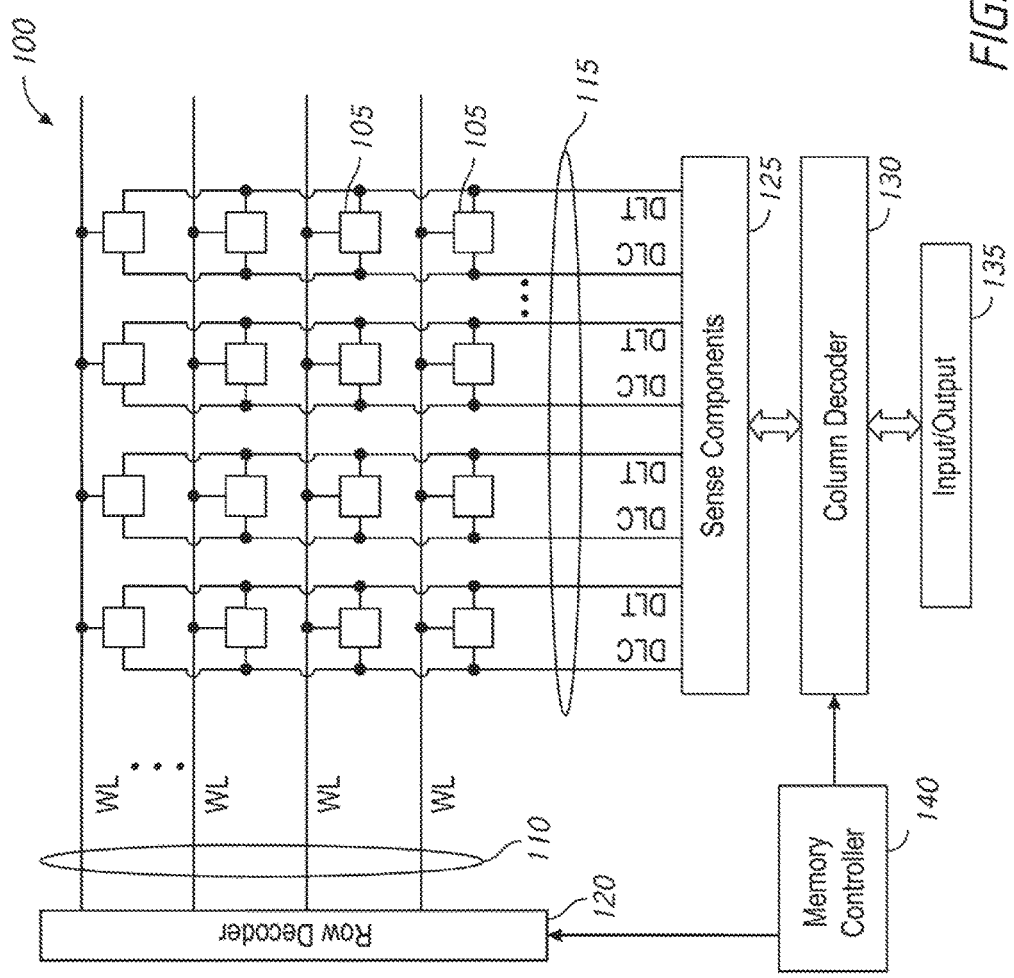
FIG. 1 is a block diagram of an example memory that supports ferroelectric memory according to various embodiments of the disclosure.

FIG. 1 illustrates an apparatus that includes an example memory 100 that supports ferroelectric memory in accordance with various embodiments of the present disclosure. Memory 100 includes memory cells 105 that are programmable to store different states. Each memory cell 105 may be programmable to store two states, denoted as a logic 0 and a logic 1. A memory cell 105 may include a capacitor that retains a charge polarity representative of the programmable states. For example, a charged and uncharged capacitor may represent two logic states, respectively. In some embodiments of the disclosure, memory cell 105 is configured to store more than two logic states, that is, the memory cell 105 is a multilevel memory cell. For example, in some embodiments of the disclosure, the memory cells may be programmable to store one of four different logic state representing two bits of data.

A ferroelectric memory cell may include a capacitor that has a ferroelectric as the dielectric material. Different levels of charge of a ferroelectric capacitor may represent different logic states. Ferroelectric memory cells 105 have beneficial properties that may result in improved performance relative to other memory architectures, for example, persistent storage of logic states without the need for periodic refresh operations.

Operations such as reading and writing may be performed on memory cells 105 by activating or selecting the appropriate access lines 110 and sense lines 115. Activating or selecting an access line 110 or a sense line 115 may include applying a voltage to the respective line. Access lines 110 and sense lines 115 are made of conductive materials. For example, access lines 110 and sense lines 115 may be made of metals (such as copper, aluminum, gold, tungsten, etc.), metal alloys, doped semiconductors, other conductive materials, or the like. According to the example of FIG. 1, each row of memory cells 105 is coupled to access lines 110 WL, and each column of memory cells 105 is coupled to sense lines 115 DLC and DLT. By activating the respective access lines 110 and sense lines 115 (e.g., applying a voltage to the access lines 110 and/or sense lines 115), a memory cell 105 at the intersection of the WL and DLC/DLT may be accessed. Accessing the memory cell 105 may include reading or writing the memory cell 105. The memory cell at the intersection of an access lines 110 and sense lines 115 may have a corresponding memory address.

In some architectures, the logic storing device of a cell, for example, a capacitor, may be electrically isolated from the sense lines by selection components. An access line 110 may be coupled to and may control a respective selection component. For example, the selection component may be a transistor and the access line 110 may be coupled to the gate of the transistor. Activating the access line 110 results in an electrical coupling or closed circuit between the capacitor of a memory cell 105 and corresponding sense line 115. The sense lines may then be accessed to either read or write the memory cell 105.

Accessing memory cells 105 may be controlled through a row decoder 120 and a column decoder 130. In some examples, a row decoder 120 receives a row address from the memory controller 140 and activates the appropriate access lines 110 based on the received row address. Similarly, a column decoder 130 receives a column address from the memory controller 140 and activates the appropriate sense lines 115. For example, memory 100 may include multiple access lines 110, and multiple sense lines 115. Thus, by activating access lines 110 WL and sense lines 115 DLC and DLT, the memory cell 105 may be accessed.

Upon accessing, a memory cell 105 may be read, or sensed, by sense component 125 to determine the stored state of the memory cell 105. For example, after accessing the memory cell 105, the ferroelectric capacitor of memory cell 105 may discharge onto corresponding sense lines 115. Discharging the ferroelectric capacitor may be based on biasing, or applying a voltage, to the ferroelectric capacitor. The discharging may cause a change in the voltages of the sense lines 115, which sense component 125 may compare to one another in order to determine the stored state of the memory cell 105. For example, if a first sense line coupled to a memory cell has a higher voltage than a second sense line coupled to the memory cell, then sense component 125 may determine that the stored state in memory cell 105 was a logic 1 and vice versa. Sense component 125 may include various transistors or amplifiers in order to detect and amplify a difference in the signals. A separate sense component 125 may be provided for each pair of sense lines DLC and DLT. The detected logic state of memory cell 105 may then be output through column decoder 130 and input/output circuit 135.

A memory cell 105 may be programmed, or written, by activating the relevant access lines 110 and sense lines 115. As discussed above, activating access lines 110 electrically couples the corresponding row of memory cells 105 to their respective sense lines 115. By controlling the relevant sense lines 115 while the access lines 110 are activated, a memory cell 105 may be written—e.g., a logic value may be stored in the memory cell 105. Column decoder 130 may accept data, for example, from the input/output circuit 135, to be written to the memory cells 105. A ferroelectric memory cell 105 may be written by applying a voltage across the ferroelectric capacitor.

The memory controller 140 may control the operation (e.g., read, write, etc.) of memory cells 105 through the various components, such as row decoder 120, column decoder 130, and sense component 125. Memory controller 140 may provide internal control signals to activate the desired access lines 110 and sense lines 115 for accessing the memory cells 105. Memory controller 140 may also control various voltage potentials used during the operation of memory 100. In general, the amplitude, shape, or duration of an applied voltage discussed herein may be adjusted or varied and may be different for the various operations for operating memory 100.

Figure 2A:
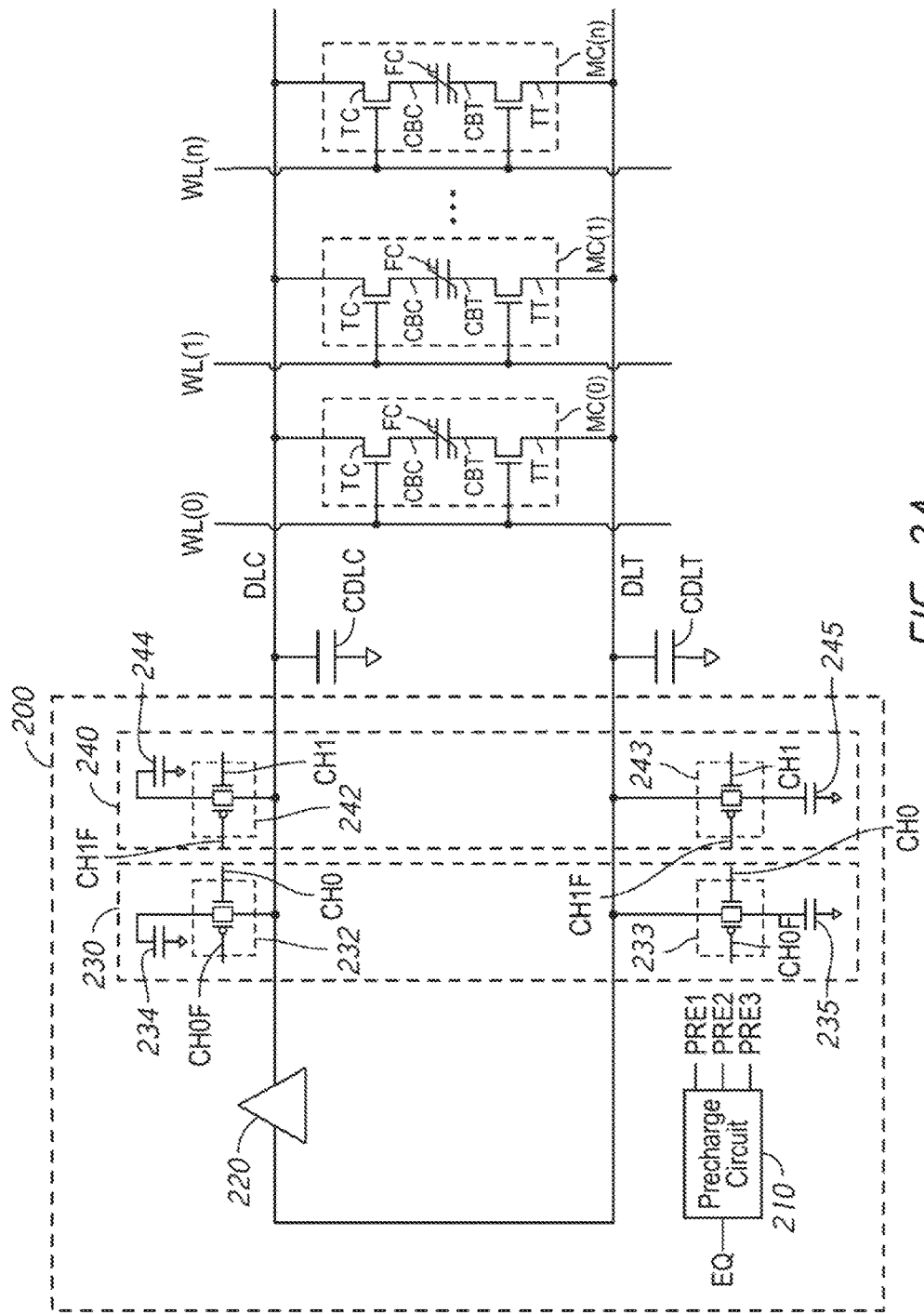
FIG. 2A is a schematic diagram of an example circuit that includes a column of memory cells according to an embodiment of the present disclosure.

FIG. 2A illustrates a column of memory cells and a sense circuit 200 according to an embodiment of the present disclosure. The column of memory cells includes memory cells MC coupled to sense lines DLC and DLT. The column of memory cells is shown in FIG. 2A includes memory cells 105 MC(0)-MC(n), where "n" depends on the array size. Each of the memory cells 105 is activated by a respective access line WL(0)-(n). The memory cells MC, access lines WL, and sense lines DLC and DLT may be examples of the memory cells 105, access lines 110, and sense lines 115. The sense circuit 200 may be included in the sense component 125 of FIG. 1. While one column of memory cells 105 is shown in FIG. 2A, a memory array may include a plurality of columns of memory cells as those shown.

Each memory cell MC(0)-MC(n) includes switches, shown in FIG. 2A as transistors TC and TT, and capacitor FC configured as a two transistor-one capacitor (2T-1C) memory cell. The switches of the memory cells MC(0)-MC(n) are shown as n-channel transistors in the embodiment of FIG. 2A. However, different transistors may be used for the switches without departing from the scope of the disclosure. In some embodiments, the capacitor FC may be a ferroelectric capacitor having a ferroelectric material disposed between capacitor plates. In other embodiments, the capacitor FC is a dielectric capacitor having a dielectric material disposed between capacitor plates. Other types of capacitors may be used as well without departing from the scope of the disclosure. The transistor TC is coupled to one plate of the capacitor FC at node CBC and the transistor TT is coupled to another plate of the capacitor FC at node CBT. The transistors TC and TT have gates coupled to a respective access line WL(0)-WL(n). The transistors TC and TT may be activated by applying an activate voltage on the respective access line WL(0)-WL(n). The transistor TC is coupled to the sense line DLC and the transistor TT is coupled to the sense line DLT. The digit lines DLC and DLT each have respective parasitic capacitances, represented by parasitic capacitances CDLC and CDLT.

The sense circuit 200 is coupled to memory cells MC by the sense lines DLC and DLT. The sense circuit 200 includes a bias circuit 230 and a bias circuit 240, and a sense amplifier 220. The bias circuits 230 and 240 are each coupled to the sense lines DLC and DLT. As will be described in more detail below, the bias circuits 230 and 240 may be used to bias the capacitor FC of an activated memory cell MC to create a voltage difference between the sense lines DLC and DLT. The sense amplifier 220 amplifies a voltage difference between the sense lines DLC and DLT, for example, by driving the sense lines to complementary voltages. The voltage difference created between the sense lines DLC and DLT may be based on a condition of the capacitor FC of an activated memory cell MC. The condition of the capacitor FC, for example, may be representative of a logic state stored by the activated memory cell MC. The logic state of memory cell MC may then be output through column decoder 130 and input/output circuit 135, as previously described.

The bias circuit 230 includes a switch circuit 232 coupled to the sense line DLC and to a capacitor 234, and further includes a switch circuit 233 coupled to the sense line DLT and to a capacitor 235. The switch circuits 232 and 233 are activated by active control signals CH0 and CH0F (e.g., CH0 active high logic level and CH0F active low logic level). The CH0F signal is the complement of the CH0 signal, that is, having a logic level that is the complement of the logic level of the CH0 signal. When activated, the switch circuit 232 couples the capacitor 234 to the sense line DLC and the switch circuit 233 couples the capacitor 235 to the sense line DLT. The bias circuit 240 includes a switch circuit 242 coupled to the sense line DLC and to a capacitor 244, and further includes a switch circuit 243 coupled to the sense line DLT and to a capacitor 245. The switch circuits 242 and 243 are activated by active control signals CH1 and CH1F (e.g., CH1 active high logic level and CH1F active low logic level). The CH1F signal is the complement of the CH1 signal, that is, having a logic level that is the complement of the logic level of the CH1 signal. When activated, the switch circuit 242 couples the capacitor 244 to the sense line DLC and the switch circuit 243 couples the capacitor 245 to the sense line DLT.

In some embodiments of the disclosure, the switch circuits 232, 233, 242, and 243 are transistor transfer gate circuits including a p-channel transistor and an n-channel transistor coupled in parallel. Other switch circuits and/or other types of transistors may be used for the switch circuits in alternative embodiments of the disclosure.

In some embodiments of the disclosure, the one or more of the capacitors 234, 235, 244, and 245 may be metal-insulator-metal (MIM) capacitors including plates of a metallic material and an insulator disposed between the metal capacitor plates. The MIM capacitors may exhibit more stable capacitor characteristics than other types of capacitors, varying less in circuit performance due to variations in process, voltage, and temperature, for example. The MIM capacitors may be formed from metallization and dielectric layers of a semiconductor device. Capacitors other than MIM capacitors may be used for the capacitors 234, 235, 244, and 245 in alternative embodiments of the disclosure. For example, in some embodiments of the disclosure a metal-oxide-semiconductor (MOS) capacitor may be used for one or more of the capacitors 234, 235, 244, and 245.

In some embodiments of the disclosure, the capacitors 234 and 235 have the same magnitude of capacitance as each other, and the capacitors 244 and 245 have the same magnitude of capacitance as each other. In some embodiments of the disclosure, the capacitors 244 and 245 also have lower capacitances than the capacitors 234 and 235. By way of non-limiting examples, in some embodiments of the disclosure, the capacitance of capacitors 234 and 235 may be 30 fF, and the capacitance of the capacitors 244 and 245 may be 20 fF. The parasitic capacitances CDLC and CDLT may have capacitances of 90 fF. The capacitor FC may have a capacitance of 30 fF. Capacitances other than those previously described by way of non-limiting examples may be used without departing from the scope of the disclosure.

The sense circuit 200 further includes a precharge circuit 210. The precharge circuit 210 provides various voltages to set an initial voltage condition for the sense circuit 200 in preparation for sensing a memory cell MC. The precharge circuit 210 is shown in FIG. 2A as providing precharge voltages PRE1, PRE2, and PRE3. However, greater or fewer precharge voltages may be provided by the precharge circuit 210 without departing from the scope of the disclosure.

In some embodiments of the disclosure, the precharge circuit 210 provides a high precharge voltage to one of the capacitors 234 and 235 and to one of the capacitors 244 and 245, provides a low precharge voltage to the other one of the capacitors 234 and 235 and to the other one of the capacitors 244 and 245, and provides to the sense lines DLC and DLT a precharge voltage that is one-half of the difference between the high and low precharge voltages. As a result, the voltage difference between the precharge voltage of the sense lines and the high precharge voltage is the same as the voltage difference between the precharge voltage of the sense lines and the low precharge voltage. For example, in some embodiments of the disclosure, the precharge circuit 210 provides a PRE1 voltage of 0.8 V to the sense lines DLC and DLT, a PRE2 voltage of 1.6 V to the capacitor 234 and to the capacitor 245, and a PRE3 voltage of 0 V to the capacitors 235 and 244. Other embodiments of the disclosure may provide different precharge voltages to the sense lines DLC and DLT, capacitors 234 and 245, and capacitors 235 and 244. The precharge circuit 210 may be controlled by internal control signals provided by a memory controller, for example, the memory controller 140 of FIG. 1.

Figure 2B:
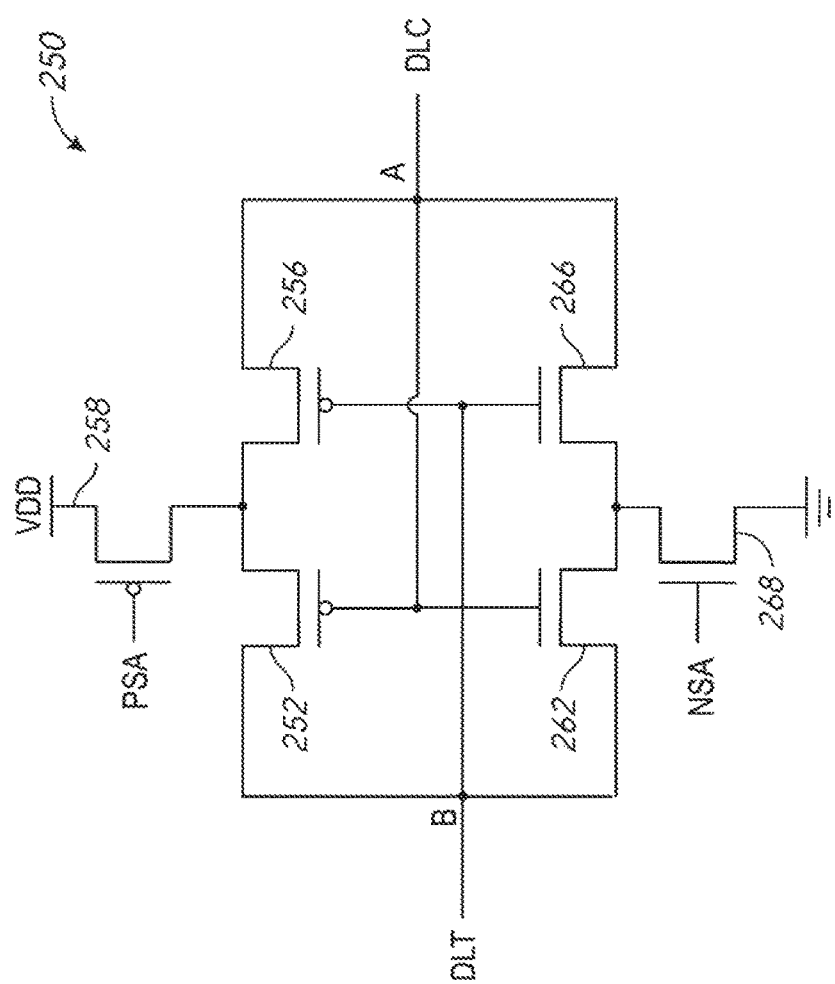
FIG. 2B is a schematic diagram of a sense component according to an embodiment of the disclosure.

FIG. 2B illustrates a sense amplifier 250 according to an embodiment of the disclosure. The sense amplifier 250 may be used for the sense amplifier 220 of FIG. 2A. The sense amplifier 250 includes p-type field effect transistors 252 and 256 and n-type field effect transistors 262 and 266. Gates of the transistor 252 and transistor 262 are coupled to sense node A. Gates of the transistor 256 and transistor 266 are coupled to sense node B. The sense node A may be coupled to the sense line DLC and the sense node B may be coupled to the sense line DLT. A p-type field effect transistor 258 is configured to be coupled to a high supply voltage (e.g., VDD power supply) and is coupled to a common node of the transistors 252 and 256. The transistor 258 is activated by an active PSA signal (e.g., active low logic). An n-type field effect transistor 268 is configured to be coupled to a reference voltage (e.g., ground) and is coupled to a common node of the transistors 262 and 266. The transistor 268 is activated by an active NSA signal (e.g., active high logic).

In operation, the sense amplifier 250 is activated by activating the PSA and NSA signals to couple the sense amplifier 250 to the voltage of the power supply and the reference voltage. When activated, the sense amplifier 250 compares the voltages of sense nodes A and B, and amplifies a voltage difference by driving the sense nodes A and B to complementary voltage levels (e.g., driving sense node A to VDD and sense node B to ground, or driving sense node A to ground and sense node B to VDD). When the sense nodes A and B have been driven to the complementary voltage levels, the states of sense nodes A and B are latched by the sense amplifier 250 and remain latched until the sense amplifier 250 is deactivated. In some embodiments of the disclosure, the sense amplifier 250 may be electrically isolated from the sense lines DLC and DLT by isolation transistors (not shown) coupled between a respective sense line DLC and DLT and sense nodes A and B. The isolation transistors may be activated in order for the sense amplifier 250 to sense and amplify a voltage difference between the sense lines DLC and DLT, and deactivated so that the sense amplifier 250 retains a sensed logic state.

Ferroelectric materials have non-linear polarization properties. FIG. 3A and FIG. 3B illustrate examples of non-linear electrical properties with hysteresis curves 300-a (FIG. 3A) and 300-b (FIG. 3B) for a memory cell for ferroelectric memory in accordance with various embodiments of the present disclosure. Hysteresis curves 300-a and 300-b illustrate an example ferroelectric memory cell writing and reading process, respectively. Hysteresis curves 300 depict the charge, Q, stored on a ferroelectric capacitor (e.g., capacitor FC of the memory cells MC of FIG. 2A) as a function of a voltage difference, V.

A ferroelectric material is characterized by a spontaneous electric polarization, for example, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals. Thus, charge is stored at the interface of the ferroelectric material and the capacitor terminals. Because the electric polarization may be maintained in the absence of an externally applied electric field for relatively long times, even indefinitely, charge leakage may be significantly decreased as compared with, for example, capacitors employed in volatile memory arrays. This may reduce the need to perform refresh operations as described above for some volatile memory architectures.

Hysteresis curves 300 may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, it should be understood that the voltages in hysteresis curves 300 represent a voltage difference across the capacitor and are directional. For example, a positive voltage may be realized by applying a positive voltage to the terminal in question (e.g., a cell top 230) and maintaining the second terminal (e.g., a cell bottom 215) at ground (or approximately zero volts (0V)). A negative voltage may be applied by maintaining the terminal in question at ground and applying a positive voltage to the second terminal, for example, positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300.

As depicted in hysteresis curve 300-a, the ferroelectric material may maintain a positive or negative polarization with a zero voltage difference, resulting in two possible charged states: charge state 305 and charge state 310. According to the example of FIG. 3, charge state 305 represents a logic 0 and charge state 310 represents a logic 1. In some examples, the logic values of the respective charge states may be reversed without loss of understanding.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-a is reached. Upon removing voltage 315, charge state 305-a follows path 320 until it reaches charge state 305 at zero voltage potential. Similarly, charge state 310 is written by applying a net negative voltage 325, which results in charge state 310-a. After removing negative voltage 325, charge state 310-a follows path 330 until it reaches charge state 310 at zero voltage. Charge states 305 and 310 may also be referred to as the remnant polarization (Pr) values, which is the polarization (or charge) that remains upon removing the external bias (e.g., voltage).

To read, or sense, the stored state of the ferroelectric capacitor, a voltage may be applied across the capacitor. In response, the stored charge, Q, changes, and the degree of the change depends on the initial charge state, and as a result, the final stored charge (Q) depends on whether charge state 305-b or 310-b was initially stored. For example, hysteresis curve 300-b illustrates two possible stored charge states 305-b and 310-b. Voltage 335 may be applied across the capacitor as previously discussed. Although depicted as a positive voltage, voltage 335 may be negative. In response to voltage 335, charge state 305-b may follow path 340. Likewise, if charge state 310-b was initially stored, then it follows path 345. The final position of charge state 305-c and charge state 310-c depend on a number of factors, including the specific sensing scheme and circuitry.

In some cases, the final charge may depend on the intrinsic capacitance of the sense line (e.g., DLC and DLT) coupled to the memory cell. For example, if the capacitor is electrically coupled to the sense line and voltage 335 is applied, the voltage of the sense line may rise due to its intrinsic capacitance. So a voltage measured at a sense component may not equal voltage 335 and instead may depend on the voltage of the sense line. The position of final charge states 305-c and 310-c on hysteresis curve 300-b may thus depend on the capacitance of the sense line and may be determined through a load-line analysis. Charge states 305-c and 310-c may be defined with respect to the sense line capacitance. As a result, the voltage of the capacitor, voltage 350 or voltage 355, may be different and may depend on the initial state of the capacitor.

By comparing the voltages of the sense lines DLC and DLT, the initial state of the capacitor may be determined. A voltage difference may be generated on the sense lines DLC and DLT such that a comparison of the respective voltages to one another is used to determine the stored logic state, for example, if the voltage of one of the sense lines is greater or less than the voltage of the other sense line. For example, one stored logic state results in the sense line DLC having a higher voltage than the sense line DLT, and another stored logic state results in the sense line DLC having a lower voltage than the sense line DLT. Upon comparison by the sense amplifier, the sensed sense line voltage may be determined to be higher or lower than the other sense line, and the stored logic value of the ferroelectric memory cell (e.g., a logic 0 or 1) may be determined.

Figure 4:
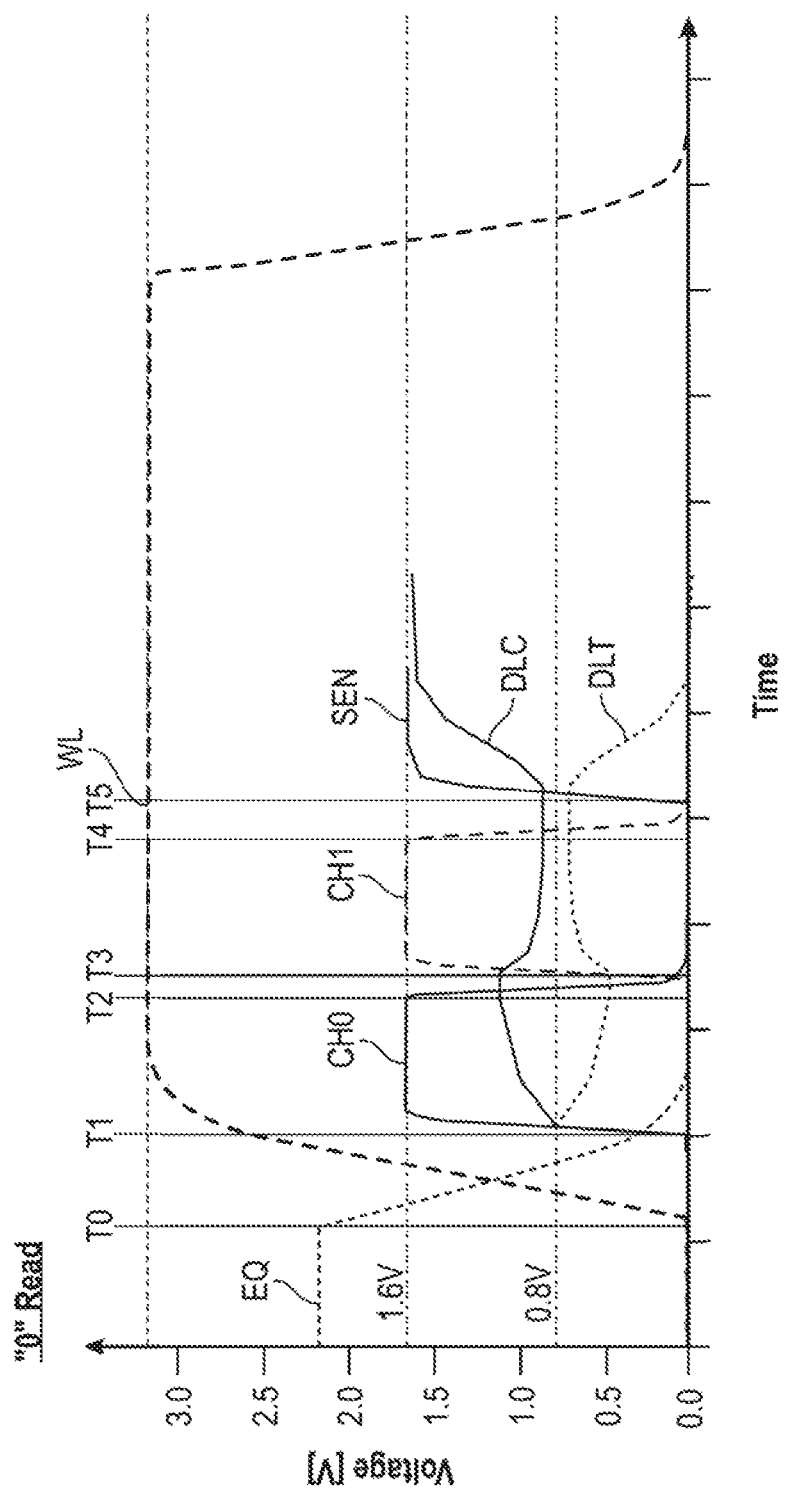
FIG. 4 is a wave diagram of various signals during operation of a sense circuit for reading a memory cell storing a first logic state according to an embodiment of the disclosure.
Figure 5:
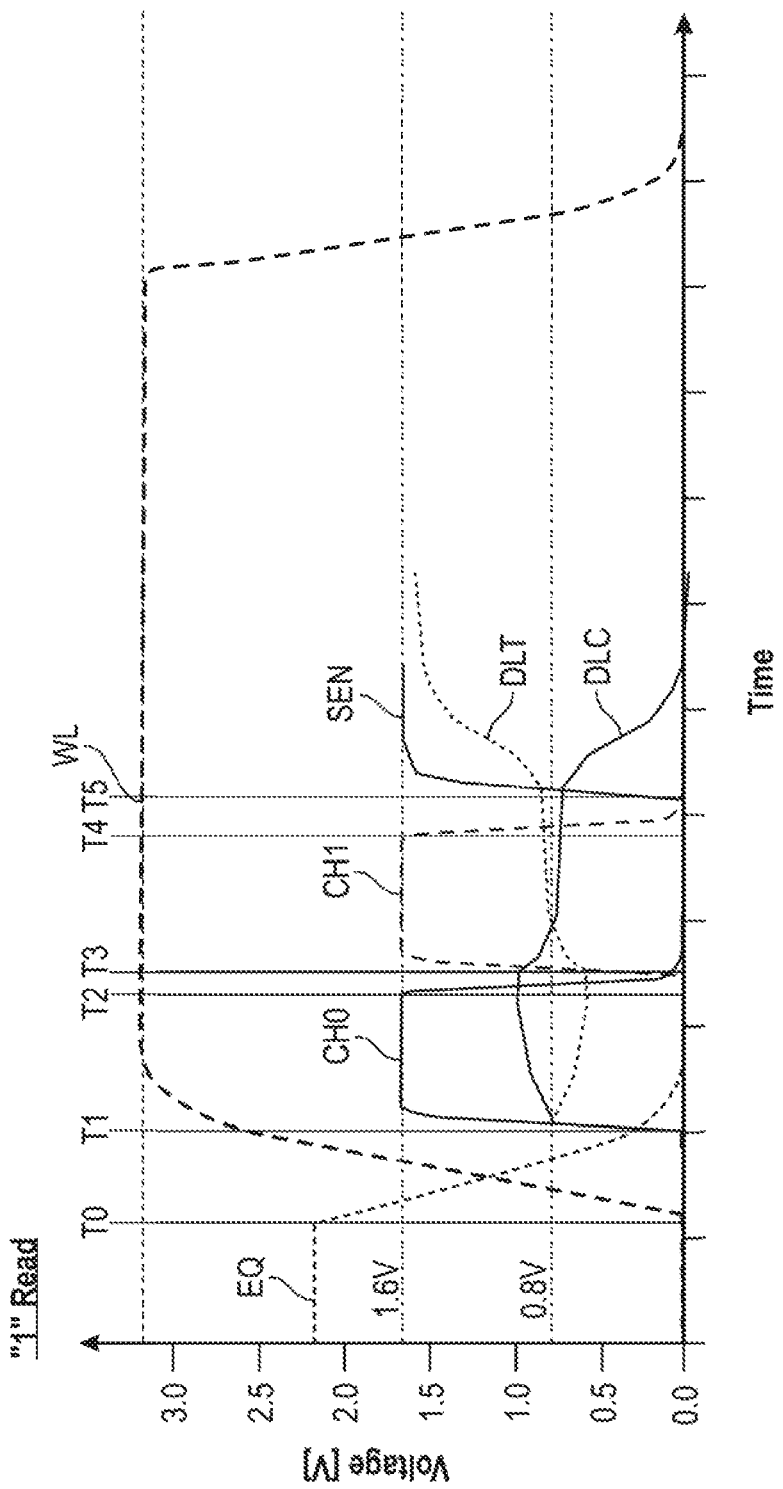
FIG. 5 is a wave diagram of various signals during operation of a sense circuit for reading a memory cell storing a second logic state according to an embodiment of the disclosure.

Operation of the sense circuit 200 will be described with reference to FIGS. 4 and 5. FIG. 4 is a wave diagram showing various signals during operation of the sense circuit 200 for reading a memory cell MC storing a first logic state (e.g., "0" data). FIG. 5 is a wave diagram showing various signals during operation of the sense circuit 200 for reading a memory cell MC when storing a second logic state (e.g., "1" data). The particular voltages described below are provided by way of example, and are not intended to limit embodiments of the disclosure to the particular examples. Other voltages may be used in different embodiments of the disclosure.

With reference to FIGS. 2A and 4, prior to time T0 the precharge circuit 210 is activated by a high logic level EQ signal to set the initial voltage conditions for the sense circuit 200 and the sense lines DLC and DLT in preparation for sensing a logic state of a memory cell MC. For example, in some embodiments of the disclosure, the voltage of the sense lines DLC and DLT are set by the precharge circuit 210 to 0.8 V. The precharge circuit 210 may further set the voltage of the capacitors 234 and 245 to 1.6 V and set the voltage of the capacitors 235 and 244 to 0 V. At time T0, the precharge circuit 210 is deactivated as the EQ signal changes to a low logic level. Also at time T0 the transistors TC and TT of a memory cell MC are activated by increasing the voltage of the access line WL to greater than the threshold voltages of the transistors TC and TT. In some embodiments of the disclosure, the access line WL is increased to greater than 3.0 V. With the transistors TC and TT activated, the capacitor FC of the activated memory cell MC is coupled to the sense lines DLC and DLT.

At time T1, the switch circuits 232 and 233 are activated by a high logic level CH0 signal as shown in FIG. 4 (and a low logic level CH0F signal not shown in FIG. 4). With the switch circuits 232 and 233 activated, the 1.6 V precharge voltage of the capacitor 234 is coupled to the 0.8 V of the sense line DLC, and the 0 V precharge voltage of the capacitor 235 is coupled to the 0.8 V of the sense line DLT. As a result, the voltages of the sense lines DLC and DLT change. In the example illustrated by FIG. 4, the voltage of the sense line DLC increases and the voltage of the sense line DLT decreases. The sense line DLC increases due to the sharing of the higher voltage of the capacitor 234 (e.g., 1.6 V) and the voltage of the sense line DLC (e.g., 0.8 V). The sense line DLT decreases due to the sharing of the voltage of the sense line DLT (e.g., 0.8 V) and the lower voltage of the capacitor 235 (e.g., 0 V).

The amount of voltage increase of the sense line DLC and the amount of voltage decrease of the sense line DLT is dependent on the condition (e.g., polarization) of the capacitor FC of the memory cell MC. For example, the voltage change (e.g., voltage increase or voltage decrease) of the sense lines DLC and DLT may be greater when the capacitor FC is in a first condition compared to when the capacitor FC is in a second condition. The present example shown by FIG. 4, as previously mentioned, is for reading the memory cell MC when storing a first logic state (e.g., "0" data), which corresponds in the present example to the first condition for the capacitor FC. The example shown by FIG. 5, which will be described in more detail below, is for reading the memory cell MC when storing a second data state (e.g., "1" data), which corresponds in the present example to the second condition for the capacitor FC.

Again with reference to FIG. 4, at time T2 the switch circuits 232 and 233 are deactivated, and at time 13, the switch circuits 242 and 243 are activated by a high logic level CH1 signal as shown in FIG. 4 and a low logic level CH1F signal (not shown in FIG. 4). With the switch circuits 242 and 243 activated, the 0 V precharge voltage of the capacitor 244 is coupled to the sense line DLC and the 1.6 V precharge voltage of the capacitor 245 is coupled to the sense line DLT. As a result, the voltages of the sense lines DLC and DLT change. In the example illustrated by FIG. 4, the voltage of the sense line DLC decreases and the voltage of the sense line DLT increases. The sense line DLC decreases due to the sharing of the voltage of the sense line DLC with the lower voltage of the capacitor 244. The sense line DLT increases due to the sharing of the higher voltage of the capacitor 245 (e.g., 1.6 V) with the voltage of the sense line DLT (e.g., 0.8 V). At time T4 the switch circuits 242 and 243 are deactivated. For the first condition of the capacitor FC as shown in FIG. 4, the voltage decrease in the sense line DLC following time T3 is less than the voltage increase in the sense line DLC following time T1, and the voltage increase in the sense line DLT following time T3 is less than the voltage decrease in the sense line DLT following time T1. As previously described, in some embodiments of the disclosure the capacitors 244 and 245 have lower capacitances than the capacitors 234 and 235. The different capacitances of the capacitors may contribute to the change in voltage of the sense lines DLC and DLT from sharing of the voltages of capacitors 244 and 245 at time T3 being less than the change in voltage of the sense lines DLC and DLT from sharing of the voltages of capacitors 234 and 235 at time T1.

At time T5, the sense amplifier 220 is activated by the SEN signal changing to a high logic level. In embodiments including the sense amplifier 250 of FIG. 2B, the SEN signal may represent the NSA signal changing to a high logic level and the PSA signal changing to a low logic level. The sense amplifier 220 amplifies the voltage difference between the sense lines DLC and DLT. In the example of FIG. 4 (i.e., reading the memory cell MC when storing a first logic state (e.g., "0" data)), the voltage of the sense line DLC is greater than the voltage of the sense line DLT following the voltage increase in the sense line DLC at time T1 and the voltage decrease in the sense line DLC at time T3 (and the voltage decrease in the sense line DLT at time T1 and the voltage increase in the sense line DLT at time T3). The activated sense amplifier 220 amplifies the voltage difference between the sense lines DLC and DLT by driving the sense line DLC to a high supply voltage (e.g., 1.6 V) and driving the sense line DLT to a low supply voltage (e.g., 0 V) to amplify the voltage difference.

As previously described, FIG. 5 is a wave diagram showing various signals during operation of the sense circuit 200 for reading a memory cell MC storing a second logic state (e.g., "1" data).

With reference to FIGS. 2A and 5, prior to time T0 the precharge circuit 210 is activated by a high logic level EQ signal to set the initial voltage conditions for the sense circuit 200 and the sense lines DLC and DLT in preparation for sensing the logic state of a memory cell MC. As previously described, in the present example, the voltage of the sense lines DLC and DLT are set by the precharge circuit 210 to 0.8 V. The voltage of the capacitors 234 and 245 are set to 1.6 V, and the voltage of the capacitors 235 and 244 are set to 0 V. At time T0, the precharge circuit 210 is deactivated as the EQ signal changes to a low logic level. Also at time T0, transistors TC and TT of a memory cell MC are activated by increasing the voltage of the access line WL to greater than the threshold voltages of the transistors TC and TT to couple the capacitor FC of the activated memory cell MC to the sense lines DLC and DLT.

At time T1, the switch circuits 232 and 233 are activated by a high logic level CH0 signal as shown in FIG. 5 (and a low logic level CH0F signal not shown in FIG. 5). With the switch circuits 232 and 233 activated, the 1.6 V precharge voltage of the capacitor 234 is coupled to the 0.8 V of the sense line DLC, and the 0 V precharge voltage of the capacitor 235 is coupled to the 0.8 V of the sense line DLT. As a result, the voltages of the sense lines DLC and DLT change. In the example illustrated by FIG. 5, the voltage of the sense line DLC increases and the voltage of the sense line DLT decreases. The sense line DLC increases due to the sharing of the higher voltage of the capacitor 234 (e.g., 1.6 V) and the voltage of the sense line DLC (e.g., 0.8 V). The sense line DLT decreases due to the sharing of the voltage of the sense line DLT (e.g., 0.8 V) and the lower voltage of the capacitor 235 (e.g., 0 V).

As previously described, the amount of voltage increase of the sense line DLC and the amount of voltage decrease of the sense line DLT is dependent on the condition (e.g., polarization) of the capacitor FC of the memory cell MC. For example, the voltage change (e.g., voltage increase or voltage decrease) of the sense lines DLC and DLT may be less when the capacitor FC is in a second condition compared to when the capacitor FC is in a first condition (e.g., FIG. 4). With reference to the example of FIG. 5, the voltage increase of the sense lines DLC (and the voltage decrease of the sense line DLT) is less than the increase/decrease in voltage in comparison to the example of FIG. 4. The present example shown by FIG. 5, as previously mentioned, is for reading the memory cell MC when storing a second logic state (e.g., "1" data), which corresponds in the present example to the second condition for the capacitor FC.

Returning to FIG. 5, at time T2 the switch circuits 232 and 233 are deactivated, and at time T3, the switch circuits 242 and 243 are activated by a high logic level CH1 signal as shown in FIG. 5 (and a low logic level CH1F signal not shown in FIG. 5). With the switch circuits 242 and 243 activated, the 0 V precharge voltage of the capacitor 244 is coupled to the sense line DLC and the 1.6 V precharge voltage of the capacitor 245 is coupled to the sense line DLT. As a result, the voltages of the sense lines DLC and DLT change. In the example illustrated by FIG. 5, the voltage of the sense line DLC decreases and the voltage of the sense line DLT increases. The sense line DLC decreases due to the sharing of the voltage of the sense line DLC and the lower voltage of the capacitor 244 (e.g., 0 V). The sense line DLT increases due to the sharing of the higher voltage of the capacitor 245 (e.g., 1.6 V) and the voltage of the sense line DLT. At time T4 the switch circuits 242 and 243 are deactivated.

At time T5, the sense amplifier 220 is activated by the SEN signal changing to a high logic level. The sense amplifier 220 amplifies the voltage difference between the sense lines DLC and DLT. In contrast to the example of FIG. 4, the decrease in voltage of the sense line DLC following time T3, for the example of FIG. 5, is greater than the increase in voltage of the sense line DLC following time T1. Additionally, the increase in the voltage of the sense line DLT following time 13 is greater than the decrease in voltage of the sense line DLT following time T1. As a result, the voltage of the sense line DLC is less than the voltage of the sense line DLT. The activated sense amplifier 220 amplifies the voltage difference between the sense lines DLC and DLT by driving the sense line DLC to the low supply voltage and driving the sense line DLT to the high supply voltage in amplify the voltage difference.

With reference to FIG. 4, the voltage increase in the sense line DLC following time T1 is greater in comparison to the voltage increase in the sense line DLC for FIG. 5 due to the capacitor FC having a positive charge condition between the nodes CBC and CBT (e.g., the node CBC is positive relative to the node CBT). The voltage provided by the capacitor 234 adds to the already positive charge condition of the capacitor FC. In contrast, the capacitor FC in the example of FIG. 5 has a negative charge condition between the nodes CBC and CBT (e.g., the node CBC is negative relative to the node CBT). The voltage provided by the capacitor 234 at time T1 first reverses the negative charge condition of the capacitor FC before the voltage of the sense line DBC increases, which results in a lesser voltage increase compared to the example of FIG. 4.

As illustrated by the examples of FIGS. 4 and 5, the condition of a capacitor FC of a memory cell MC may be determined as previously described, and consequently, with each of the two conditions corresponding to a different logic state (e.g., a first condition shown by FIG. 4 corresponds to "0" data; a second condition shown in FIG. 5 corresponds to "1" data), data stored by the memory cell MC may be read.

Figure 6:
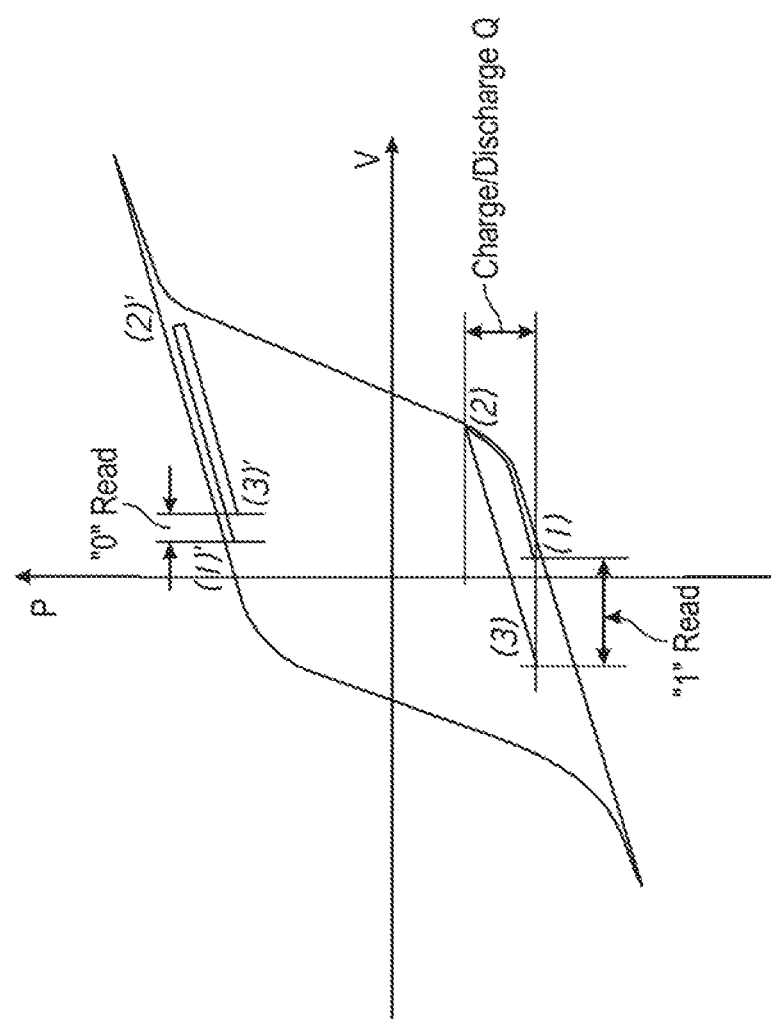
FIG. 6 is a diagram of changes in polarization and voltage on a capacitor during operation according to FIGS. 4 and 5.

FIG. 6 is a diagram that illustrates changes in polarization and voltage on the capacitor FC during operation of the examples of FIGS. 4 and 5 according to an embodiment of the disclosure. FIG. 6 includes an example hysteresis curve for the capacitor FC. An abscissa represents voltage V applied the capacitor FC and an ordinate represents polarization P, which corresponds to the charge stored on the capacitor plates of the capacitor FC. The previously described first condition of the capacitor FC is represented by the curve crossing the ordinate for a positive polarity and generally labeled as "0" read. The previously described second condition of the capacitor FC is represented by the curve crossing the ordinate for a negative polarity and generally labeled as "1" read. FIG. 4 corresponds to the "0" read and FIG. 5 corresponds to the "1" read.

As shown in FIG. 6, when the capacitor FC is in the first condition (i.e., "0" read), the voltage provided by the capacitor 234 to the sense line DLC following time T1 causes the charge stored on the plate to increase (represented in FIG. 6 as moving from (1)' to (2)'). The voltage provided by the capacitor 244 to the sense line DLC following time T3 causes the charge stored on the plate to decrease (represented in FIG. 6 as moving from (2)' to (3)'). As shown in FIG. 6, and as previously described with reference to FIG. 4, the voltage decrease in the sense line DLC caused by the voltage of capacitor 244 following time T3 is less than the voltage increase in the sense line DLC caused by the voltage of capacitor 234 following time T1 (represented in FIG. 6 as a difference between (1)' and (3)').

As shown in FIG. 6, when the capacitor FC is in the second condition (i.e., "1" read), the voltage provided by the capacitor 234 to the sense line DLC following time T1 causes the charge stored on the plate to increase (represented in FIG. 6 as moving from (1) to (2)). The voltage provided by the capacitor 244 to the sense line DLC following time T3 causes the charge stored on the plate to decrease (represented in FIG. 6 as moving from (2) to (3)). As shown in FIG. 6, and as previously described with reference to FIG. 5, the voltage decrease in the sense line DLC caused by the voltage of capacitor 244 following time T3 is greater than the voltage increase in the sense line DLC caused by the voltage of capacitor 234 following time T1 (represented in FIG. 6 as a difference between (1) and (3)).

The difference in the voltage resulting from increasing and then decreasing the voltage across the capacitor FC between the first and second conditions is illustrated by FIG. 6. As illustrated, the change in voltage for the second condition results in a greater voltage difference than for the first condition. The charge increase and discharge due to the increase and decrease in voltage across the capacitor FC is the same for the first and second conditions, which is represented by the vertical change from (1) to (2) and from (1)' to (2)'. However, due to the properties of the capacitor FC (e.g., ferroelectric properties), the charge increase for the second condition (i.e., moving from (1) to (2)) results in less voltage across the capacitor FC compared to the first condition, as illustrated in FIG. 6 as the voltage not shifting as far right for the second condition. Consequently, for the second condition, the discharge of the capacitor FC (i.e., moving from (2) to (3)) results in a voltage decrease that is greater than the voltage increase (i.e., moving from (1) to (2)). As previously described with reference to FIG. 5, the greater voltage decrease than voltage increase causes the sense line DLC to be less than the sense line DLT for the second condition compared to the first condition.

Figure 7:
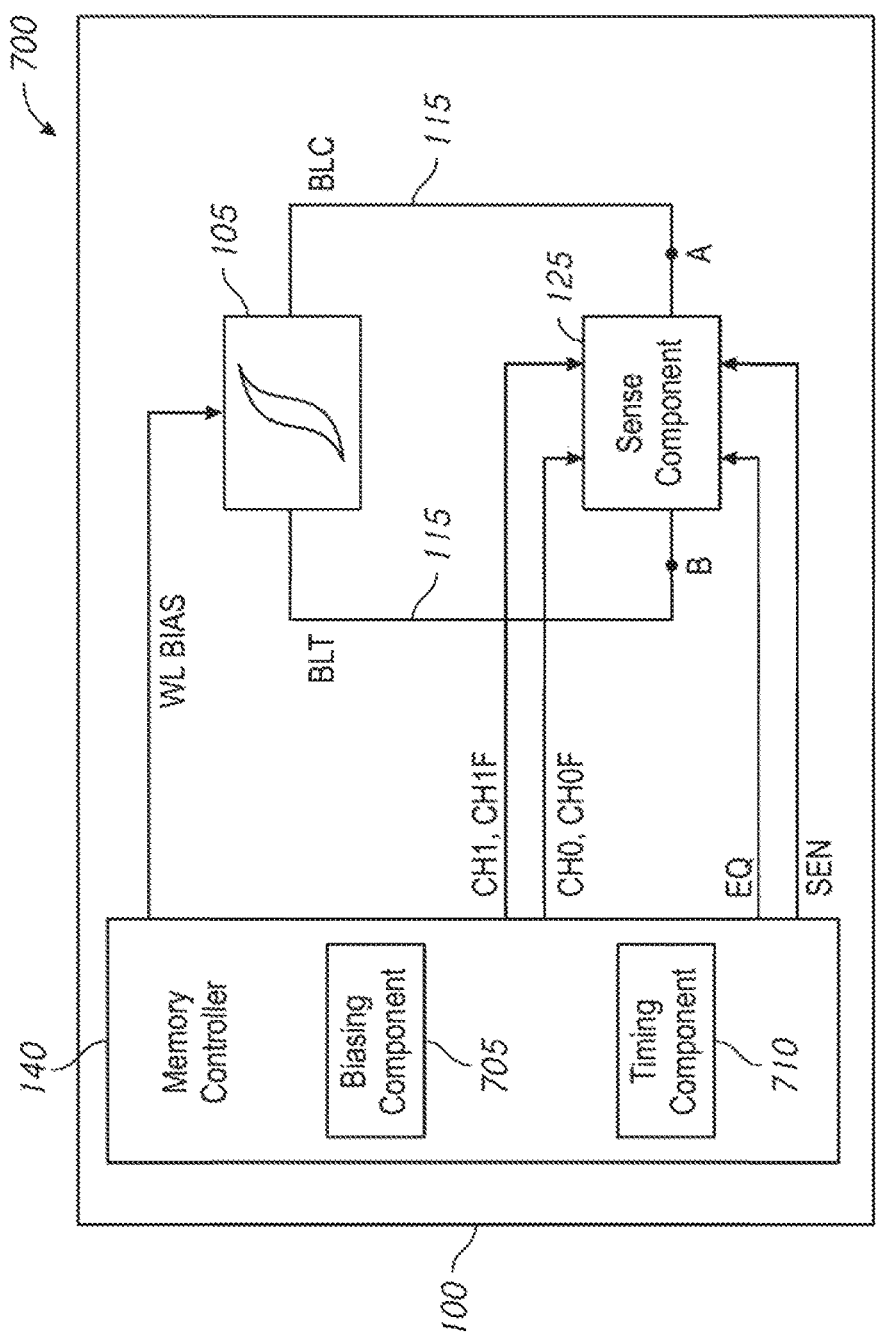
FIG. 7 is a block diagram of a memory array that supports a ferroelectric memory in accordance with various embodiments of the present disclosure.

FIG. 7 illustrates a block diagram of a portion of memory device 700 that includes memory 100 that supports a ferroelectric memory in accordance with various embodiments of the present disclosure. Memory 100 may be referred to as an electronic memory apparatus and includes memory controller 140 and memory cell 105, which may be examples of memory controller 140 and memory cell 105 as previously described with reference to any of FIGS. 1-6.

Memory controller 140 may include biasing component 705 and timing component 710, and may operate as described with reference to FIG. 1. Memory controller 140 may be in electronic communication with access lines 110, sense lines 115, and sense component 125, which may be examples of access line 110, sense line 115, and sense component 125 described with reference to any of FIGS. 1-6. Memory controller 140 may provide control signals CH0, CH0F, Ch1, CH1F to the sense component 125. The memory controller 140 may further provide an EQ signal and a SEN signal to the sense component 125. The components of memory 100 may be in electronic communication with each other and may perform the functions described with reference to any of FIGS. 1-6.

Memory controller 140 may be configured to activate access lines 110 or sense lines 115 by applying voltages to the access and sense lines. For example, biasing component 705 may be configured to apply a voltage to operate memory cell 105 to read or write memory cell 105 as described above. In some cases, memory controller 140 may include a row decoder, column decoder, or both, as described with reference to FIG. 1. This may enable memory controller 140 to access one or more memory cells 105. Additionally, biasing component 705 may provide voltage potentials for the operation of sense component 125, for example, providing voltage potentials used for precharging the sense component 125 and sense lines DLC and DLT.

Memory controller 140 may couple memory cell 105 to sense component 125. Memory controller 140 may further determine a logic state of the ferroelectric memory cell 105 based on activating sense component 125. In some cases, memory controller 140 may perform its operations using timing component 710. For example, timing component 710 may control the timing of the various access line selections or cell top biasing, including timing for switching and voltage application to perform the memory functions, such as reading and writing, discussed herein. In some cases, timing component 710 may control the operations of biasing component 705.

Sense component 125 may compare voltages of the sense lines DLC and DLT coupled to an activated memory cell 105 to determine a logic state stored by the memory cell. The sense component 125 may latch the output, where it may be used in accordance with the operations of an electronic device that includes the memory device 700.

Figure 8:
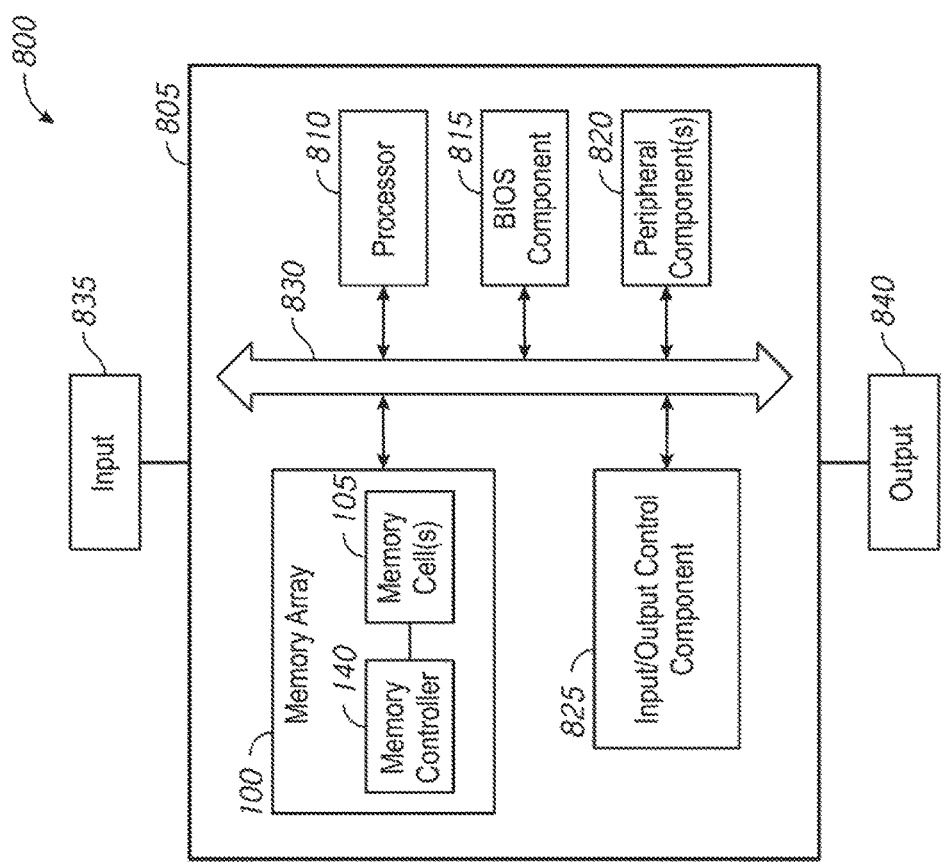
FIG. 8 is a block diagram of a system that supports a ferroelectric memory in accordance with various embodiments of the present disclosure.

FIG. 8 illustrates a system 800 that supports a ferroelectric memory in accordance with various embodiments of the present disclosure. System 800 includes a device 805, which may be or include a printed circuit board to connect or physically support various components. Device 805 may be a computer, notebook computer, laptop, tablet computer, mobile phone, or the like. Device 805 includes a memory 100, which may be an example of memory 100 previously described. Memory 100 may contain memory controller 140 and memory cell(s) 105, which may be examples of memory controller 140 and memory cells 105 previously described. Device 805 may also include a processor 810, BIOS component 815, peripheral component(s) 820, and input/output control component 825. The components of device 805 may be in electronic communication with one another through bus 830.

Processor 810 may be configured to operate memory 100 through memory controller 140. In some cases, processor 810 may perform the functions of memory controller 140 as previously described. In other cases, memory controller 140 may be integrated into processor 810. Processor 810 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. The processor 810 may perform various functions and operate the memory 100 as described herein. Processor 810 may, for example, be configured to execute computer-readable instructions stored in memory 100 to cause device 805 perform various functions or tasks.

BIOS component 815 may be a software component that includes a basic input/output system (BIOS) operated as firmware, which may initialize and run various hardware components of system 800. BIOS component 815 may also manage data flow between processor 88 and the various components, e.g., peripheral components 820, input/output control component 825, etc. BIOS component 815 may include a program or software stored in read-only memory (ROM), flash memory, or any other non-volatile memory.

Peripheral component(s) 820 may be any input or output device, or an interface for such devices, that is integrated into device 805. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. Input/output control component 825 may manage data communication between processor 810 and peripheral component(s) 820, input devices 835, or output devices 840. Input/output control component 825 may also manage peripherals not integrated into device 805. In some cases, input/output control component 825 may represent a physical connection or port to the external peripheral. Input 835 may represent a device or signal external to device 805 that provides input to device 805 or its components. This may include a user interface or interface with or between other devices. In some cases, input 835 may be a peripheral that interfaces with device 805 via peripheral component(s) 820 or may be managed by input/output control component 825.

Output 840 may represent a device or signal external to device 805 configured to receive output from device 805 or any of its components. Examples of output 840 may include a display, audio speakers, a printing device, another processor or printed circuit board, etc. In some cases, output 840 may be a peripheral that interfaces with device 805 via peripheral component(s) 820 or may be managed by input/output control component 825.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
a memory cell including a memory capacitor and further including first and second switches, the first switch coupled to a first plate of the memory capacitor and the second switch coupled to the second plate of the memory capacitor, wherein the first and second switches are activated responsive to activating an access line;
a first sense line coupled to the first switch;
a second sense line coupled to the second switch;

a sense amplifier coupled to the first and second sense lines, the sense amplifier configured to amplify a voltage difference between the first and second sense lines;

first and second capacitors;

first and second transfer gates, the first transfer gate coupled to the first capacitor and the first sense line and the second transfer gate coupled to the second capacitor and the second sense line, wherein the first and second transfer gates are activated responsive to a first control signal;

third and fourth capacitors; and third and fourth transfer gates, the third transfer gate coupled to the third capacitor and the first sense line and the fourth transfer gate coupled to the fourth and the second sense line, wherein the third and fourth transfer gates are activated responsive to a second control signal.

2. The apparatus of claim 1 wherein the third and fourth capacitors each have lower capacitance than the first and second capacitors.

3. The apparatus of claim 1 wherein the memory capacitor comprises a ferroelectric capacitor.

4. The apparatus of claim 1 wherein the first and second transistors each comprise a transistor.

5. The apparatus of claim 1 wherein the first and second sense lines have respective capacitances and wherein the first and second capacitors have lower capacitances than the capacitances of the first and second sense lines.

6. The apparatus of claim 1 wherein the sense amplifier comprises first and second transistor inverter circuits cross-coupled.

7. The apparatus of claim 1, further comprising a precharge circuit configured to precharge the first and fourth capacitors to a first voltage, the second and third capacitors to a second voltage, and the first and second sense lines to a third voltage.

8. The apparatus of claim 7 the third voltage is less than the first voltage and greater than the second voltage, and wherein a voltage difference between the first voltage and the third voltage is equal to a voltage difference between the third voltage and the second voltage.

9. An apparatus, comprising:

first and second sense lines;

a ferroelectric memory cell configured to be selectively coupled to the first and second sense lines;

a sense amplifier coupled to the first and second sense lines, the sense amplifier configured to amplify a voltage difference between the first and second sense lines when activated;

first and third capacitors each selectively coupled through first and third switch circuits, respectively, to the first sense line; and second and fourth capacitors each selectively coupled through second and fourth switch circuits, respectively, to the second sense line, wherein the first capacitor is configured to store a first voltage to be shared with the first sense line to increase a voltage thereon and the second capacitor is configured to store a second voltage to be shared with the second sense line to decrease a voltage thereon, and wherein the fourth capacitor is configured to store a fourth voltage to be shared with the second sense line to increase a voltage thereon and the third capacitor is configured to store a third voltage to be shared with the first sense line to decrease a voltage thereon and cause a voltage difference between the first and second sense lines to be amplified by the sense amplifier, the voltage difference based at least in part on a polarity of the ferroelectric memory cell.

10. The apparatus of claim 9 wherein the first, second, third, and fourth switch circuits comprise first, second, third, and fourth transfer gates.

11. The apparatus of claim 10 wherein each of the first, second, third, and fourth transfer gates each comprises:

an n-channel transistor; and a p-channel transistor coupled in parallel with the n-channel transistor.

12. The apparatus of claim 9 wherein the first, second, third, and fourth capacitors each comprises a metal-insulator-metal capacitor.

13. The apparatus of claim 9 wherein the ferroelectric memory cell comprises:

a ferroelectric capacitor;

a first switch coupled to a first plate of the memory capacitor and to the first sense line; and a second switch coupled to a second plate of the memory capacitor and to the second sense line.

14. A method, comprising:

sharing a first voltage to increase a voltage of a first sense line coupled to a first capacitor plate of a ferroelectric capacitor of a memory cell, wherein the ferroelectric capacitor has a polarity;

sharing a second voltage to decrease a voltage of a second sense line coupled to a second capacitor plate of the ferroelectric capacitor of the memory cell;

sharing a third voltage to increase the voltage of the second sense line coupled to the second capacitor plate of the ferroelectric capacitor of the memory cell;

sharing a fourth voltage to decrease the voltage of the first sense line coupled to the first capacitor plate of the ferroelectric capacitor of the memory cell; and amplifying a voltage difference between the first sense line and the second sense line that results from the voltage sharing, wherein the voltage difference is based at least in part on the polarity of the ferroelectric capacitor.

15. The method of claim 14 wherein sharing the first voltage to increase a voltage of the first sense line comprises coupling a first capacitor to the first sense line, wherein the first capacitor is precharged to a first voltage greater than a voltage of the first sense line.

16. The method of claim 15 wherein sharing the third voltage to increase the voltage of the second sense line comprises coupling a third capacitor to the second sense line, wherein the third capacitor is precharged to the first voltage and wherein the third capacitor has less capacitance than the first capacitor.

17. The method of claim 14 wherein sharing the second voltage to decrease increase a voltage of the second sense line comprises coupling a second capacitor to the second sense line, wherein the second capacitor is precharged to a second voltage less than a voltage of the second sense line.

18. The method of claim 14 wherein sharing the first voltage to increase the voltage of the first sense line for a first polarity of the ferroelectric capacitor results in a greater increase in the voltage of the first sense line than for sharing the first voltage to increase the voltage of the first sense line for a second polarity.

19. The method of claim 14 wherein the first sense line has a greater voltage than the second sense line resulting from the voltage sharing for the ferroelectric capacitor having a first polarity and wherein the first sense line has a lesser voltage than the second sense line resulting from the voltage sharing for the ferroelectric capacitor having a second polarity.

20. A method, comprising:
   activating a memory cell to couple a ferroelectric capacitor to first and second sense lines;
   discharging a first capacitor having a first voltage to the first sense line having a second voltage;
   discharging from a second sense line having the second voltage to the second capacitor having a third voltage;
   discharging from a third capacitor having the first voltage to the second sense line;
   discharging from the first sense line to a fourth capacitor having the third voltage, wherein the third and fourth capacitors have lower capacitances than the first and second capacitors; and
   amplifying a voltage difference on the first and second sense lines resulting from the discharging.

21. The method of claim 20 wherein a first voltage difference between the first voltage and the second voltage is equal to a second voltage difference between the second voltage and the third voltage.

22. The method of claim 20 wherein the first voltage comprises a supply voltage and the third voltage comprises ground.

23. The method of claim 20, further comprising:
   precharging the first and third capacitors to the first voltage;
   precharging the first and second sense lines to the second; and
   precharging the second and fourth capacitors to the third voltage, wherein the second voltage less than the first voltage and greater than the third voltage.

24. The method of claim 20 wherein discharging the first capacitor to the first sense line comprises activating a first transfer gate coupled between the first capacitor and first sense line and wherein discharging the second sense line to the second capacitor comprises activating a second transfer gate coupled between the second capacitor and second sense line.

25. The method of claim 20, wherein amplifying the voltage difference on the first and second lines resulting from the discharging comprises:
   driving the first or second sense line having a greater voltage to the first voltage; and
   driving the first or second sense line having a lesser voltage to the third voltage.

* * * * *

UNITED STATES PATENT AND TRADEMARK OFFICE
CERTIFICATE OF CORRECTION

PATENT NO. : 10,083,973 B1
APPLICATION NO. : 15/673224
DATED : September 25, 2018
INVENTOR(S) : Yasushi Matsubara Page 1 of 1

It is certified that error appears in the above-identified patent and that said Letters Patent is hereby corrected as shown below:

In the Claims

| | Reads | Should Read |
|---|---|---|
| Column 16, Line 54 Claim 17 | "voltage to decrease increase" | --voltage to decrease-- |
| Column 18, Line 7 Claim 23 | "the second voltage less than" | --the second voltage is less than-- |

Signed and Sealed this
Nineteenth Day of March, 2019

Andrei Iancu
*Director of the United States Patent and Trademark Office*